United States Patent
Singh et al.

(10) Patent No.: US 11,837,653 B2
(45) Date of Patent: Dec. 5, 2023

(54) LATERAL BIPOLAR JUNCTION TRANSISTOR INCLUDING A STRESS LAYER AND METHOD

(71) Applicant: GlobalFoundries U.S. Inc., Malta, NY (US)

(72) Inventors: Jagar Singh, Clifton Park, NY (US); Alexander M. Derrickson, Saratoga Springs, NY (US); Alvin J. Joseph, Williston, VT (US); Andreas Knorr, Saratoga Springs, NY (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 42 days.

(21) Appl. No.: 17/555,561

(22) Filed: Dec. 20, 2021

(65) Prior Publication Data

US 2023/0065785 A1 Mar. 2, 2023

Related U.S. Application Data

(60) Provisional application No. 63/238,242, filed on Aug. 30, 2021.

(51) Int. Cl.
*H01L 29/73* (2006.01)
*H01L 29/737* (2006.01)
(Continued)

(52) U.S. Cl.
CPC ........ *H01L 29/737* (2013.01); *H01L 29/0821* (2013.01); *H01L 29/1008* (2013.01); *H01L 29/6625* (2013.01); *H01L 29/66242* (2013.01)

(58) Field of Classification Search
CPC ............... H01L 29/737; H01L 29/0821; H01L 29/1008; H01L 29/66242; H01L 29/6625
See application file for complete search history.

(56) References Cited

U.S. PATENT DOCUMENTS 6,940,149 B1 9/2005 Divakaruni et al.
7,932,166 B2 4/2011 Frohberg et al.
(Continued)

OTHER PUBLICATIONS

Chan et al., "Strain for CMOS performance Improvement," IEEE Custom Integrated Circuits Conference, 2005, pp. 667-674.
(Continued)

*Primary Examiner* — Syed I Gheyas
(74) *Attorney, Agent, or Firm* — Francois Pagette; Hoffman Warnick LLC (57) ABSTRACT

Disclosed is a semiconductor structure with a lateral bipolar junction transistor (BJT). This semiconductor structure can be readily integrated into advanced silicon-on-insulator (SOI) technology platforms. Furthermore, to maintain or improve upon performance characteristics (e.g., cut-off frequency (fT)/maximum oscillation frequency (fmax) and beta cut-off frequency) that would otherwise be negatively impacted due to changing of the orientation of the BJT from vertical to lateral, the semiconductor structure can further include a dielectric stress layer (e.g., a tensilely strained layer in the case of an NPN-type transistor or a compressively strained layer in the case of a PNP-type transistor) partially covering the lateral BJT for charge carrier mobility enhancement and the lateral BJT can be configured as a lateral heterojunction bipolar transistor (HBT). Also disclosed is a method for forming the semiconductor structure.

18 Claims, 9 Drawing Sheets

(51) Int. Cl.
*H01L 29/08* (2006.01)
*H01L 29/66* (2006.01)
*H01L 29/10* (2006.01)

(56) References Cited

U.S. PATENT DOCUMENTS

| | | |
|---|---|---|
| 8,420,493 B2 | 4/2013 | Ning et al. |
| 9,252,233 B2 | 2/2016 | Hsiao et al. |
| 2018/0083126 A1* | 3/2018 | Hashemi ............... H01L 29/167 |

OTHER PUBLICATIONS

Yang et al., "Dual Stress Liner for High Performance Sub-45nm Gate Length SOI CMOS Manufacturing," IEDM Technical Digest. IEEE International Electron Devices Meeting, 2004, pp. 1075-1077.

\* cited by examiner

LATERAL BIPOLAR JUNCTION TRANSISTOR INCLUDING A STRESS LAYER AND METHOD

BACKGROUND

Field of the Invention

The present invention relates to semiconductor structures and, more particularly, to embodiments of semiconductor structure including a lateral bipolar junction transistor (BJT) and embodiments of a method of forming the semiconductor structure.

Description of Related Art

Advantages associated with manufacturing complementary metal oxide semiconductor (CMOS) designs using advanced silicon-on-insulator (SOI) processing technology platforms (e.g., a fully-depleted silicon-on-insulator (FD-SOI) processing technology platform) include, for example, reduced power, reduced area consumption, reduced cost, high performance, multiple core threshold voltage (Vt) options, etc. CMOS designs manufactured on such SOI wafers are used in a variety of applications including, but not limited to, Internet-of-Things (IOT) devices, wearable devices, smartphone processors, automotive electronics, and radio frequency integrated circuits (RFICs) (including millimeter wave (mmWave) ICs). These same applications could benefit from the inclusion of bipolar junction transistors (BJTs) because BJTs tend to have more drive and are generally considered better suited for analog functions than field effect transistors (FETs). However, typically, such BJTs are formed as vertical devices (e.g., with an in-substrate collector, a base aligned above the collector, and an emitter aligned above the base), which are not readily integrated into advanced SOI processing technology platforms.

SUMMARY

Disclosed herein are embodiments of a semiconductor structure. The semiconductor structure can include a lateral bipolar junction transistor (BJT). The lateral BJT can include a collector, an emitter and a base positioned laterally between the collector and the emitter. The semiconductor structure can further include a first dielectric layer and, particularly, a dielectric stress layer that only partially covers the lateral BJT with one end being above the lateral BJT between the collector and the emitter. For example, the first dielectric layer can be over the collector and can further extend onto the base such that one end of the first dielectric layer is aligned above the base.

Disclosed herein are embodiments of a semiconductor structure formed in an advanced silicon-on-insulator (SOI) technology platform. In these embodiments, the semiconductor structure can include a semiconductor substrate, an insulator layer on the semiconductor substrate, and a semiconductor layer on the insulator layer. The semiconductor structure can include a lateral bipolar junction transistor (BJT) and, more particularly, a lateral heterojunction bipolar transistor (HBT). The lateral HBT can include a base. The base can include a first base region within the semiconductor layer, a second base region on the first base region, and a third base region on and wider than the second base region. The lateral HBT can also include a collector and an emitter. The base can be positioned laterally between the collector and the emitter. Furthermore, the collector and the emitter can be made of a first semiconductor material and at least the second base region can be made of a second semiconductor material different from the first semiconductor material, thus, providing the heterojunction. The semiconductor structure can further include a first dielectric layer and, particularly, a dielectric stress layer that only partially covers the lateral HBT with one end being above the lateral HBT between the collector and the emitter. For example, the first dielectric layer can be over the collector and can further extend onto the base such that one end of the first dielectric layer is aligned above the base.

Also disclosed herein are method embodiments for forming the above-described semiconductor structure. The method embodiments can include forming a lateral bipolar junction transistor (BJT) including a collector, an emitter, and a base positioned laterally between the collector and the emitter. The method embodiments can further include forming a first dielectric layer and, particularly, a dielectric stress layer partially covering the lateral BJT with one end above the lateral BJT between the collector and the emitter.

BRIEF DESCRIPTION OF THE SEVERAL VIEWS OF THE DRAWINGS

The present invention will be better understood from the following detailed description with reference to the drawings, which are not necessarily drawn to scale and in which:

FIG. 3.1 is a cross-section diagram illustrating a partially completed semiconductor structure formed according to the flow diagram of FIG. 2;

FIG. 3.2 is a cross-section diagram illustrating a partially completed semiconductor structure formed according to the flow diagram of FIG. 2;

FIGS. 3.3A and 3.3B are top view and cross-section diagrams, respectively, illustrating a partially completed semiconductor structure formed according to the flow diagram of FIG. 2;

FIG. 3.4 is a cross-section diagram illustrating a partially completed semiconductor structure formed according to the flow diagram of FIG. 2;

FIGS. 3.5A and 3.5B are top view and cross-section diagrams, respectively, illustrating a partially completed semiconductor structure formed according to the flow diagram of FIG. 2;

FIGS. 3.6A and 3.6B are top view and cross-section diagrams, respectively, illustrating a partially completed semiconductor structure formed according to the flow diagram of FIG. 2;

FIG. 3.7 is a cross-section diagram illustrating a partially completed semiconductor structure formed according to the flow diagram of FIG. 2;

FIG. 3.8 is a cross-section diagram illustrating a partially completed semiconductor structure formed according to the flow diagram of FIG. 2;

FIG. 3.9 is a cross-section diagram illustrating a partially completed semiconductor structure formed according to the flow diagram of FIG. 2;

FIG. 3.10 is a cross-section diagram illustrating a partially completed semiconductor structure formed according to the flow diagram of FIG. 2;

FIG. 3.11 is a cross-section diagram illustrating a partially completed semiconductor structure formed according to the flow diagram of FIG. 2;

FIG. 3.12 is a cross-section diagram illustrating a partially completed semiconductor structure formed according to the flow diagram of FIG. 2;

FIG. 3.13 is a cross-section diagram illustrating a partially completed semiconductor structure formed according to the flow diagram of FIG. 2; and FIG. 3.14 is a cross-section diagram illustrating a partially completed semiconductor structure formed according to the flow diagram of FIG. 2.

DETAILED DESCRIPTION

As mentioned above, advantages associated with manufacturing complementary metal oxide semiconductor (CMOS) designs using advanced silicon-on-insulator (SOI) processing technology platforms (e.g., a fully-depleted silicon-on-insulator (FDSOI) processing technology platform) include, for example, reduced power, reduced area consumption, reduced cost, high performance, multiple core threshold voltage (Vt) options, etc. CMOS designs manufactured on such SOI wafers are used in a variety of applications including, but not limited to, Internet-of-Things (JOT) devices, wearable devices, smartphone processors, automotive electronics, and radio frequency integrated circuits (RFICs) (including millimeter wave (mmWave) ICs). These same applications could benefit from the inclusion of bipolar junction transistors (BJTs) because BJTs tend to have more drive and are generally considered better suited for analog functions than field effect transistors (FETs). However, typically, such BJTs are formed as vertical devices (e.g., with an in-substrate collector, a base aligned above the collector, and an emitter aligned above the base), which are not readily integrated into advanced SOI processing technology platforms.

In view of the foregoing, disclosed herein are embodiments of a semiconductor structure with a lateral bipolar junction transistor (BJT). This semiconductor structure can be readily integrated into advanced silicon-on-insulator (SOI) technology platforms. Furthermore, to maintain or improve upon performance characteristics (e.g., cut-off frequency (fT)/maximum oscillation frequency (fmax) and beta cut-off frequency) that would otherwise be negatively impacted due to changing the orientation of the BJT from vertical to lateral, the semiconductor structure can further include a dielectric stress layer (e.g., a tensilely strained layer in the case of an NPN-type transistor or a compressively strained layer in the case of a PNP-type transistor) partially covering the lateral BJT for charge carrier mobility enhancement and the lateral BJT can, optionally, be configured as a lateral heterojunction bipolar transistor (HBT). Also disclosed herein are embodiments of a method for forming the semiconductor structure.

Figure 1A:
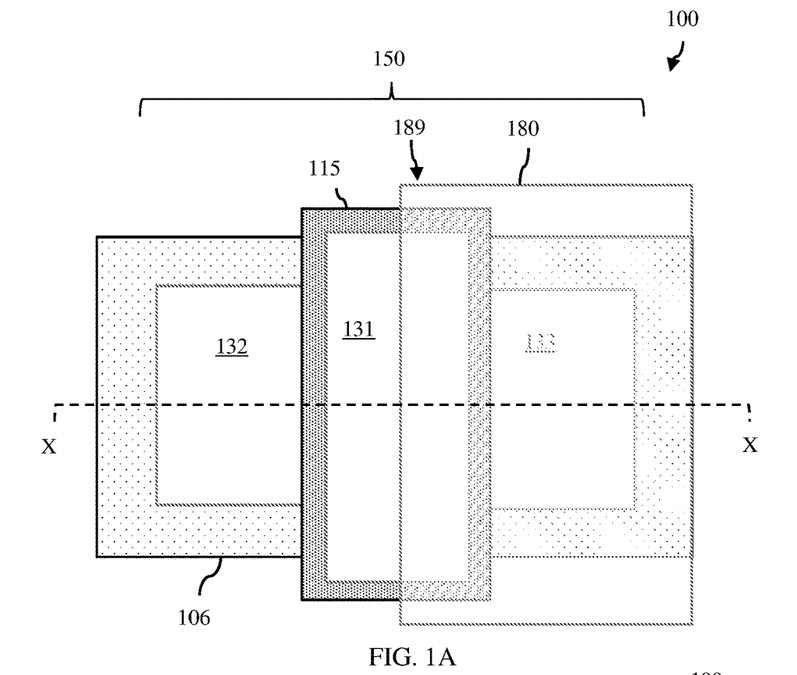
FIGS. 1A-1B are layout and cross-section diagrams, respectively, illustrating disclosed embodiments of a semiconductor structure with a lateral bipolar junction transistor partially covered by a dielectric stress layer.
Figure 1B:
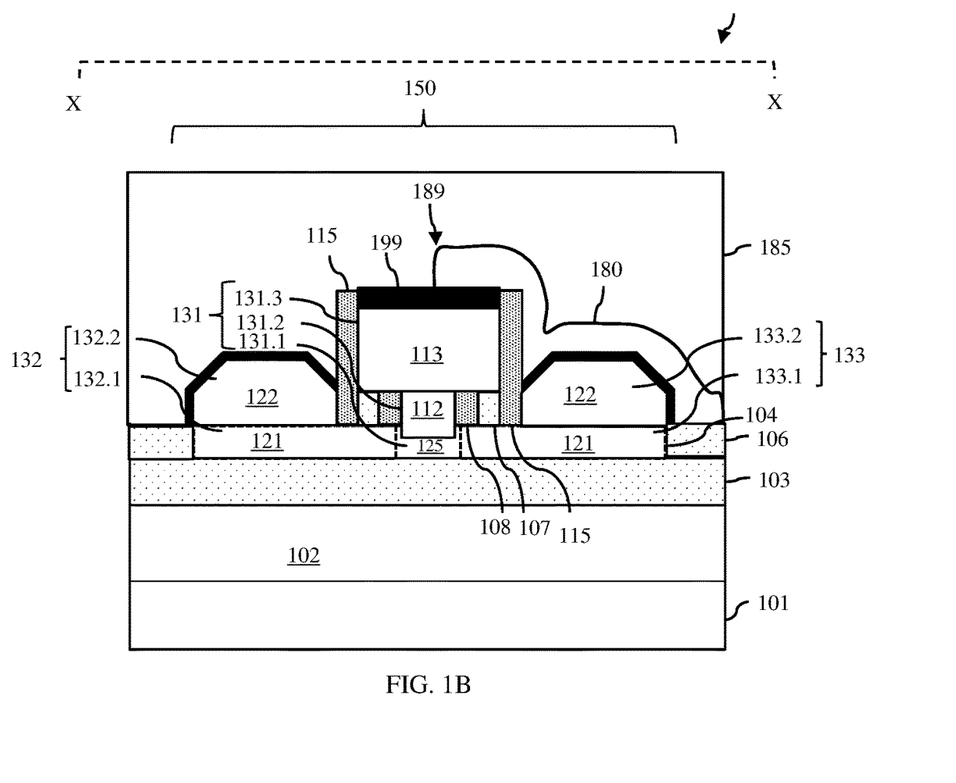

FIGS. 1A-1B are layout and cross-section diagrams, respectively, illustrating disclosed embodiments of a semiconductor structure 100 with a lateral bipolar junction transistor (BJT) 150 partially covered by a dielectric stress layer 180. It should be noted that the lateral BJT 150 can be either a standard BJT, where the collector, emitter and base are made of the same semiconductor material (e.g., silicon), or a heterojunction bipolar transistor (HBT), where at least a portion of the base is made of a different semiconductor material (e.g., silicon germanium) than the collector and the emitter.

Specifically, the semiconductor structure 100 can be, for example, a semiconductor-on-insulator structure (e.g., a silicon-on-insulator (SOI) structure). That is, the semiconductor structure 100 can include a semiconductor substrate 101. The semiconductor substrate 101 can be a first semiconductor material (e.g., silicon), which is monocrystalline in structure.

Optionally, the semiconductor substrate 101 can be doped so as to have P-type conductivity at a relatively low conductivity level. Thus, for example, the semiconductor substrate 101 could be a P− silicon substrate.

Optionally, the semiconductor substrate 101 can include a buried well 102 (also referred to as a buried dopant implant region). The buried well 102 could be doped so as to have P-type conductivity (e.g., so as to be a buried Pwell). Alternatively, the buried well 102 could be doped so as to have N-type conductivity (e.g., so as to be a buried Nwell).

The semiconductor structure 100 can further include an insulator layer 103 on the top surface of the semiconductor substrate 101 (e.g., over the buried well 102). The insulator layer 103 can be, for example, a silicon dioxide layer (also referred to herein as a buried oxide (BOX) layer) or a layer of any other suitable insulator material.

The semiconductor structure 100 can further include a semiconductor layer 104 on the insulator layer 103. The semiconductor layer 104 can be monocrystalline in structure. The semiconductor layer 104 can be the same semiconductor material as the semiconductor substrate 101. That is, the semiconductor layer 104 can be made of the first semiconductor material (e.g., silicon). Alternatively, the semiconductor layer 104 could be a different semiconductor material than the semiconductor substrate 101. That is, the semiconductor layer 104 could be made of a second semiconductor material (e.g., silicon germanium). The semiconductor layer 104 can be undoped. Alternatively, the semiconductor layer 104 can be doped. Doping of the semiconductor layer 104 can vary depending upon whether the lateral BJT 150 is an NPN-type or a PNP-type transistor. For example, for an NPN-type transistor, the semiconductor layer 150 can be doped so as to have P-type conductivity at a relatively low conductivity (e.g., so as to be a P-semiconductor layer), whereas, for a PNP-type transistor, the semiconductor layer 104 could be doped so as to have N-type conductivity at a relatively low conductivity level (e.g., so as to be an N− semiconductor layer).

The semiconductor structure 100 can further include shallow trench isolation (STI) regions 106. The STI regions 106 can extend essentially vertically through the semiconductor layer 104 to the insulator layer 103 and can define the boundaries of a device area that includes the lateral BJT 150.

As mentioned above, the semiconductor structure 100 can further include the lateral BJT 150. Those skilled in the art will recognize that a BJT typically includes three terminals: a collector, an emitter, and a base between the collector and the emitter. In a vertical BJT, the collector, base and emitter are stacked vertically. In a lateral BJT, the base is positioned laterally between the collector and the emitter. In any case, the base will include at least an extrinsic base region having a first-type conductivity and the collector and the emitter will have a second-type conductivity that is different from the first-type conductivity. Thus, an NPN-type transistor will include at least P-type extrinsic base, an N-type collector, and an N-type emitter; whereas, a PNP-type transistor will include at least an N-type extrinsic base, a P-type collector and a P-type emitter. In a standard BJT, the same semiconductor material (e.g., silicon) is used for the base, collector and emitter. Alternatively, different semiconductor materials could be used. In this case, the BJT is referred to as a heterojunction bipolar transistor (HBT). Those skilled in the art will recognize that a heterojunction bipolar transistor (HBT) is BJT in which the collector and emitter are made, at least in part, of one semiconductor material and the base is made, at least in part, of a different semiconductor material. The use of differing semiconductor materials at the emitter-base junction and at the base-collector junction creates heterojunctions suitable for handling higher frequencies. Thus, in the semiconductor structure 100, the lateral BJT 150 can include three terminals: a collector 133, an emitter 132, and a base 131 positioned laterally between the collector 133 and the emitter 132.

The base 131 can be above the insulator layer 103 and can include, for example, three different stacked regions. These three different stacked regions can include a first base region 131.1, a second base region 131.2 above the first base region, and a third base region 131.3 above the second base region.

The first base region 131.1 can be within the semiconductor layer 104 and, more particularly, can include a first area 125 of the semiconductor layer 104, which optionally has a recessed top surface. As mentioned above, the semiconductor layer 104 can be monocrystalline in structure and can be either the first semiconductor material (e.g., silicon) or the second semiconductor material (e.g., silicon germanium). The first area 125 can be undoped or doped. For example, the first area can be a P− area in the case of an NPN-type transistor or an N− area in the case of a PNP-type transistor.

The second base region 131.2 can be an epitaxial semiconductor layer 112. For a standard BJT, the epitaxial semiconductor layer 112 could be the first semiconductor material (e.g., silicon). For an HBT, the epitaxial semiconductor layer 112 could be the second semiconductor material (e.g., silicon germanium). In any case, this epitaxial semiconductor layer 112 can fill a relatively narrow base opening, which is defined by the space between first sidewall spacers 108 (e.g., sidewall spacers made of silicon nitride or some other suitable dielectric sidewall spacer material) and which is aligned above the first area 125 of the semiconductor layer 104. In other words, the second base region 131.2 is positioned laterally between the first sidewall spacers 108 and aligned above and in contact with the first base region 131.1, as illustrated. The epitaxial semiconductor layer 112 can be selectively grown from the semiconductor layer 104 during processing so that it is essentially monocrystalline in structure. Furthermore, the epitaxial semiconductor layer 112 can be undoped (i.e., intrinsic) or doped, as discussed below.

Doping of the epitaxial semiconductor layer 112 can vary depending upon whether the lateral BJT 150 is an NPN-type or PNP-type transistor. For example, for an NPN-type transistor, the epitaxial semiconductor layer 112 can be undoped or, alternatively, doped so as to have P-type conductivity at a relatively low conductivity level or so as to have a graded P-type profile (e.g., from undoped or low-doped near the semiconductor layer 104 to higher doped away from the semiconductor layer 104). Thus, for example, for an NPN-type transistor, the second base region 131.2 can be an intrinsic base region (e.g., an i-SiGe base region) or, alternatively, a P− base region or a base region with graded P-type profile from undoped or P− to P or P+. However, for a PNP-type transistor, the epitaxial semiconductor layer 112 can be undoped or, alternatively, doped so as to have N-type conductivity at a relatively low conductivity level or so as to have a graded N-type profile (e.g., from undoped or low-doped near the semiconductor layer 104 to higher doped away from the semiconductor layer 104). Thus, for example, for a PNP-type transistor, the second base region 131.2 can be an intrinsic base region (e.g., an i-SiGe base) or, alternatively, an N− base region or a base region with a graded N-type profile from undoped or N− to N or N+.

It should be noted that second sidewall spacers 107 (e.g., sidewall spacers made of silicon dioxide or some other suitable dielectric sidewall spacer material) can be positioned laterally adjacent to the first sidewall spacers 108 on opposing sides of the second base region 131.2. The first and second sidewall spacers can have essentially the same heights and, more particularly, the tops of the first and second sidewall spacers can be essentially co-planar.

The third base region 131.3 can be aligned above, can be immediately adjacent to, and can be wider than the second base region 131.2 such that it extends laterally over the first sidewall spacers 108 and the second sidewall spacers 107. Thus, the base 131 is essentially T-shaped. As illustrated, opposing sidewalls of the third base region 131.3 can be essentially vertically aligned with outer vertical surfaces of the second sidewall spacers 107. The third base region 131.3 can be an epitaxial semiconductor layer 113 of the first semiconductor material (e.g., silicon) or, alternatively, of some other suitable base semiconductor material. The epitaxial semiconductor layer 113 can be non-selectively grown during processing so that it is essentially polycrystalline in structure (e.g., so that it is polysilicon). The epitaxial semiconductor layer 113 can be doped and doping will vary depending upon whether the lateral BJT 150 is an NPN-type transistor or a PNP-type transistor. For example, for an NPN-type transistor, the epitaxial semiconductor layer 113 can be doped so as to have P-type conductivity at a relatively high conductivity level and, particularly, at a higher conductivity level than the substrate and at a higher conductivity level than the lower base regions and, thus, so that the third base region 131.3 is, for example, a P+ extrinsic base region. For a PNP-type transistor, the epitaxial semiconductor layer 113 can be doped so as to have N-type conductivity at a relatively high conductivity level and, particularly, at a higher conductivity level than the lower base regions and, thus, so that the third base region 131.3 is, for example, an N+ extrinsic base region.

It should be noted that third sidewall spacers 115 (e.g., sidewall spacers made of silicon nitride or some other suitable dielectric sidewall spacer material) can be positioned laterally adjacent to the opposing sidewalls of the third base region 131.3 and can also cover the outer vertical surfaces of the second sidewall spacers 107 below.

As mentioned above, the three terminals of the lateral BJT 150 can also include the collector 133 and the emitter 132 on opposing sides of the base 131.

In one exemplary structure, the collector 133 and emitter 132 can be essentially symmetric. The collector 133 can include a first collector region 133.1 and a second collector region 133.2 on the first collector region 133.1. The emitter 132 can include a first emitter region 132.1 and a second emitter region 132.2 on the first emitter region 132.1. The first collector region 133.1 and the first emitter region 132.1 can include doped regions 121 in the semiconductor layer 104, which optionally have recessed top surfaces (not shown) and which are on opposing sides of the first base region 131.1 (i.e., the first base region 131.1 is positioned laterally between the first collector region 133.1 and the first emitter region 132.1). The second collector region 133.2 and the second emitter region 132.2 can be epitaxial semiconductor layers 122 of the first semiconductor material (e.g., silicon) and can be doped. Doping of the epitaxial semiconductor layers 122 can vary depending upon whether the lateral BJT 150 is an NPN-type transistor or a PNP-type transistor. For example, for an NPN-type transistor, the epitaxial semiconductor layers 122 can be doped so as to have N-type conductivity at a relatively high conductivity level. Furthermore, an anneal performed during processing can result in the portions of the semiconductor layer 104 below also being doped so as to have N-type conductivity at a relatively high conductivity level (i.e., see doped regions 121). Thus, for example, for an NPN- type transistor, the first and second collector regions 132.1-32.2 and the first and second emitter regions 133.1-133.2 can be N+ collector and emitter regions. For a PNP-type transistor, the epitaxial semiconductor layers 122 can be doped so as to have P-type conductivity at a relatively high conductivity level. Furthermore, an anneal performed during processing can result in the portions of the semiconductor layer 104 below also being doped so as to have P-type conductivity at a relatively high conductivity level (i.e., see doped regions 121). Thus, for example, for a PNP-type transistor, the first and second collector regions 132.1-132.2 and the first and second emitter regions 133.1-133.2 can be P+ regions.

It should be noted that the configurations of the collector 133 and emitter 132 described above are provided for illustration purposes. Alternatively, these regions 132-133 could be asymmetric and/or have some other suitable configuration. In any case, the base 131 is positioned laterally between the collector 133 and the emitter 132.

Optionally, the lateral BJT 150 can further include metal silicide layers 199 on the uppermost surfaces of the base 131, the collector 133, and the emitter 132. The metal silicide layers 199 can be, for example, layers of cobalt silicide (CoSi), nickel silicide (NiSi), tungsten silicide (WSi), titanium silicide (TiSi), or any other suitable metal silicide material.

The semiconductor structure 100 can further include a first dielectric layer 180 that only partially covers the lateral BJT 150. The first dielectric layer 180 can be a dielectric stress layer. In some embodiments, the first dielectric layer 180 can be, for example, a silicon nitride layer. The first dielectric layer 180 can be formed so as to have either a tensile strain or a compressive strain. Specifically, the first dielectric layer 180 (i.e., the dielectric stress layer) can have either a tensile strain or a compressive strain, depending upon whether the lateral BJT 150 is an NPN-type transistor or a PNP-type transistor. For example, for an NPN-type transistor, the first dielectric layer 180 can be a tensilely strained layer for electron mobility enhancement, whereas, for a PNP-type transistor, the first dielectric layer 180 can be compressively strained layer for hole mobility enhancement. Such a dielectric stress layer applies the corresponding strain to the component(s) of the lateral BJT below to improve performance by enhancing charge carrier mobility.

For example, the first dielectric layer 180 can cover only one side of the lateral BJT 150 and one end 189 of the first dielectric layer 180 can be aligned above the lateral BJT 150 somewhere between the collector 133 and the emitter 132. In some embodiments, the first dielectric layer 180 can completely cover the collector 133 and can partially cover the base 131 such that one end 189 of the first dielectric layer 180 is aligned above the base 131 and stress is applied to the collector-base junction, as illustrated. Alternatively, the first dielectric layer 180 could completely cover the collector region 133 and could further extend completely over the base 131 such that one end 189 of the first dielectric layer 180 is aligned above the third sidewall spacer 115 between the base 131 and the emitter 132. With a first dielectric layer 180 positioned over the collector 133 and at least partially over the base 131, the collector 133 and base 131 will be strained, whereas the emitter 132 would remain relaxed.

For example, in the case of an NPN-type transistor where the first dielectric layer 180 is tensilely strained, the collector 133 will be a longitudinally tensile and vertically compressive collector, the base 131 will similarly be a longitudinally tensile and vertically compressive base, whereas the emitter 132 will be a relaxed emitter. However, in the case of a PNP-type transistor where the first dielectric layer 180 is compressively strained, the collector 133 will be a longitudinally compressive and vertically tensile collector, the base 131 will similarly be a longitudinally compressive and vertically tensile base, whereas the emitter 132 will be a relaxed emitter. Maximum performance benefits and, particularly, enhanced charge carrier mobility and, thereby faster switching speeds have been exhibited in embodiments with such an asymmetric dielectric stress layer above the collector-base junction and not above the emitter-base junction.

It should, however, be understood that the figures are not intended to be limiting and that, alternatively, the first dielectric layer 180 can cover some different portion of the transistor in order to fine tune the strain applied to the different components of the lateral BJT 150. For example, the first dielectric layer 180 could completely cover the collector 133 only without extending onto the base 131 such that one end 189 of the first dielectric layer 180 is aligned above the third sidewall spacer 115 between the base 131 and the collector 133. In this case, only the collector would be strained and the base and the emitter would be relaxed. Alternatively, the first dielectric layer 180 could only partially cover the collector 133 and only partially cover the base 131 such that one end of the first dielectric layer 180 is aligned above the collector 133 and another end 189 of the first dielectric layer 180 is aligned above the base 131 or the first dielectric layer 180 could only partially cover the collector 133 and completely over the base 131 such that one end of the first dielectric layer 180 is aligned above the collector 133 and another end 189 of the first dielectric layer 180 is aligned above the third sidewall spacer 115 between the emitter 132 and the base 131. In these cases, both the collector and base would be strained to some lesser extent and the emitter would still be relaxed. Alternatively, the first dielectric layer 180 could be on the emitter 132 and, optionally, extend onto and/or over the base 131 without further extending onto the collector 133 (e.g., so that the emitter and, optionally, the base are strained but the collector is relaxed), and so on.

The semiconductor structure 100 can further include one or more second dielectric layers 185 on the first dielectric layer and further extending laterally beyond the end 189 of the first dielectric layer and onto the relaxed portion of the lateral BJT (e.g., over the collector 133) and onto the STI 106. The second dielectric layer(s) can include, for example, one or more conformal dielectric layers (e.g., a conformal silicon nitride etch stop layer) and a blanket dielectric layer (e.g., a blanket silicon dioxide layer or a blanket layer of some other suitable dielectric material) on the conformal dielectric layer(s). The semiconductor structure 100 can further include middle of the line (MOL) contacts including contacts extending through the dielectric layer(s) to the base, collector, and emitter.

By partially covering a lateral BJT with the first dielectric layer 180 and, particularly, with a dielectric stress layer (e.g., a tensilely strained layer in the case of an NPN-type transistor or a compressively strained layer in the case of a PNP-type transistor) for enhanced charge carrier mobility and by optionally configuring the lateral BJT as a lateral HBT (e.g., with the base including SiGe and the emitter and collector including Si) performance characteristics (e.g., cut-off frequency (fT)/maximum oscillation frequency (fmax) and beta cut-off frequency) can be improved.

Figure 2:
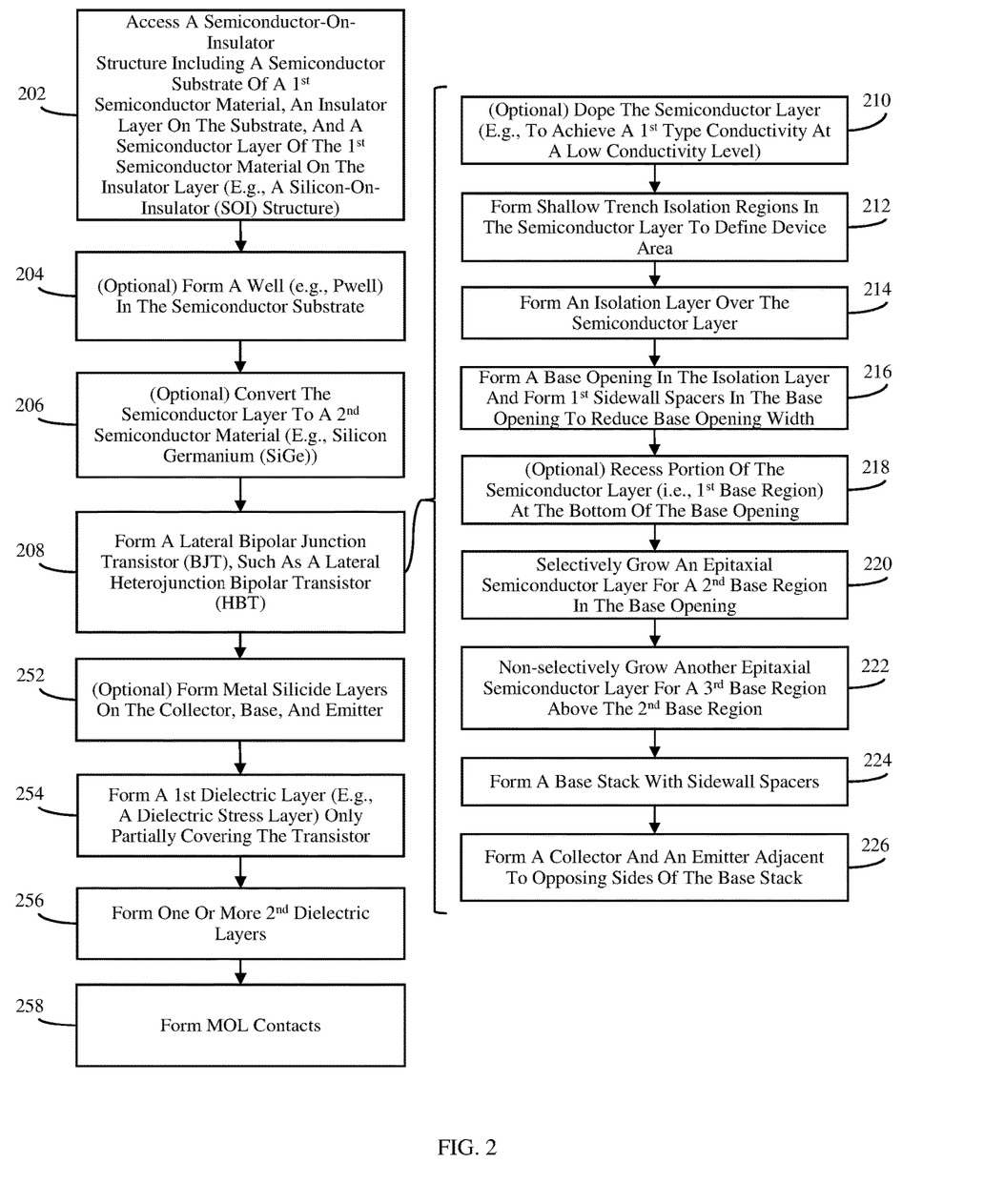
FIG. 2 is a flow diagram illustrating embodiments of a method of forming a semiconductor structure with a lateral bipolar junction transistor partially covered by a dielectric stress layer.
Figure 3:
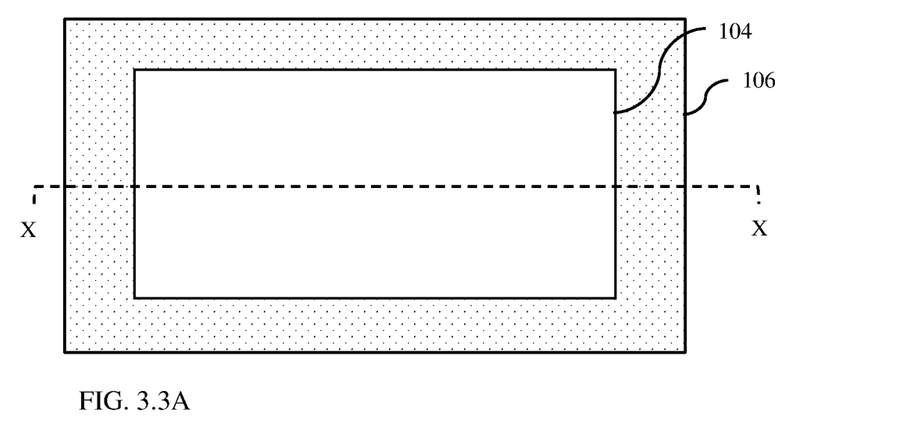

Referring to the flow diagram of FIG. 2, also disclosed herein are embodiments of a method of forming a semiconductor-on-insulator structure (e.g., a silicon-on-insulator (SOI) structure), such as the structure 100 described in detail above and illustrated in FIGS. 1A-1B, that includes a lateral bipolar junction transistor (BJT) (e.g., either a standard BJT or heterojunction bipolar transistor (HBT)) that is partially covered with a first dielectric layer and, particularly, with a dielectric stress layer for improved performance.

Figure 31:
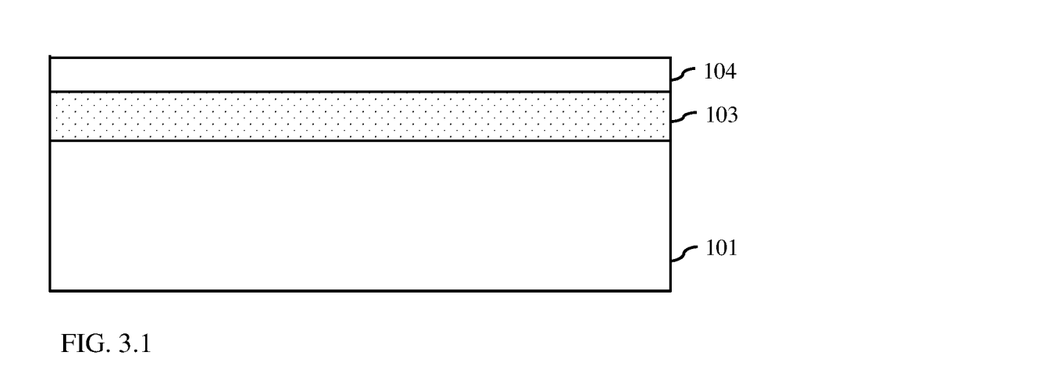

The method embodiments can begin with an initial semiconductor-on-insulator structure (see process 202 and FIG. 3.1). This semiconductor-on-insulator structure can include a semiconductor substrate 101; an insulator layer 103 on the top surface of the semiconductor substrate 101, and a semiconductor layer 104 on the insulator layer 103. The semiconductor substrate 101 and the semiconductor layer 104 can, for example, be made of the same semiconductor material and, particularly, a first semiconductor material (e.g., silicon or some other suitable semiconductor substrate material). Alternatively, the semiconductor layer 104 could be made of a second semiconductor material that is different from the first semiconductor material (e.g., a silicon germanium or some other suitable semiconductor material instead of silicon). In any case, the semiconductor substrate 101 and the semiconductor layer 104 can both be monocrystalline in structure. The semiconductor substrate 101 can be doped so as to have P-type conductivity at a relatively low conductivity level. Thus, for example, the semiconductor substrate 101 can be a P– silicon substrate. The insulator layer 103 can be a silicon dioxide layer (also referred to herein as a buried oxide (BOX) layer) or a layer of some other suitable insulator material.

Figure 32:
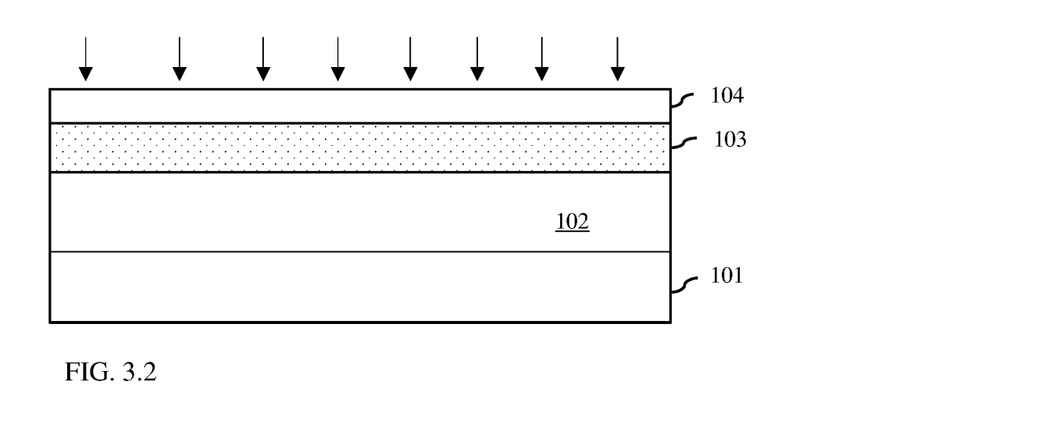

Optionally, a dopant implantation process can be performed in order to form a well 102 also referred to as a dopant implant region) in the semiconductor substrate and, particularly, at the top surface of the semiconductor substrate adjacent to the insulator layer 103 (see process 204 and FIG. 3.2). It should be noted that the conductivity type of the well 102 can vary depending upon whether an NPN-type transistor or a PNP-type transistor is being formed. For example, for an NPN-type transistor, a P-type dopant can be implanted at the top surface of the P-substrate adjacent to the insulator layer 103 so that the resulting well 102 is a Pwell and has a P-type higher conductivity level than the adjacent lower portion of the P-substrate. For a PNP-type transistor, an N-type dopant can be implanted at the top surface of the P-substrate adjacent to insulator layer 103 so that the resulting well 102 is an Nwell.

Optionally, if the semiconductor layer 104 is made of the first semiconductor material (e.g., silicon) and it is optimal for the semiconductor layer 104 to instead be made of a second semiconductor material (e.g., silicon germanium), a conversion process can be performed (see process 206 and FIG. 3.2). For example, a germanium condensation process can be performed at process 206 in order to convert a silicon layer on the insulator layer 103 into a silicon germanium layer on the insulator layer 103. Germanium condensation processing is well known in the art and, thus, the details of such processing has been omitted from this specification in order to allow the readers to focus on the salient aspects of the disclosed embodiments. The resulting silicon germanium layer can still be monocrystalline in structure.

A lateral bipolar junction transistor (BJT) can then be formed using the semiconductor layer 104 (see process 208). It should be noted that the lateral BJT formed at process 208 can be a standard BJT, where the collector, emitter and base comprise the same semiconductor material (e.g., silicon) or an HBT, where at least a portion of the base comprises a different semiconductor material than the collector and the emitter. Additionally, it should also be noted that in the discussion of the process steps below reference is made to first-type conductivity and to second-type conductivity and whether the first-type conductivity and second-type conductivity are P-type conductivity and N-type conductivity, respectively, or N-type conductivity and P-type conductivity, respectively, depends upon whether an NPN-type transistor or a PNP-type transistor is being formed at process 208. Specifically, for an NPN-type transistor, the first-type conductivity refers to P-type conductivity and the second-type conductivity refers to N-type conductivity, whereas, for a PNP-type transistor, the first-type conductivity refers to N-type conductivity and the second-type conductivity refers to P-type conductivity.

Formation of the lateral BJT can begin with an optional dopant implantation process to dope the semiconductor layer 104 with a first-type conductivity dopant such that the semiconductor layer 104 has the first-type conductivity at a relatively low conductivity level (see process 210 and FIG. 3.2). For example, for an NPN-type transistor, a P-type dopant can be implanted so that the semiconductor layer has P-type conductivity at a relatively low conductivity level (e.g., so that the semiconductor layer becomes a P– semiconductor layer), whereas, for a PNP-type transistor, an N-type dopant can be implanted so that the semiconductor layer has N-type conductivity at a relatively low conductivity level (e.g., so that the semiconductor layer becomes an N– semiconductor layer).

Shallow trench isolation (STI) regions 106 can be formed (see process 212 and FIGS. 3.3A and 3.3B). The STI regions 106 can be formed so that they define the boundaries of a device area and so that they extend essentially vertically through the semiconductor layer 104 to the insulator layer 103. Specifically, at process 212, trenches for STI regions can be formed (e.g., lithographically patterned and etched using conventional STI processing techniques) such that they extend essentially vertically through the semiconductor layer to the insulator layer and such that they define a device area within the semiconductor layer. The trenches can further be filled with one or more layers of isolation material (e.g., silicon dioxide, silicon nitride, etc.) and a chemical mechanical polishing (CMP) process can be performed to remove any of the isolation materials from above the semiconductor layer.

Figure 34:
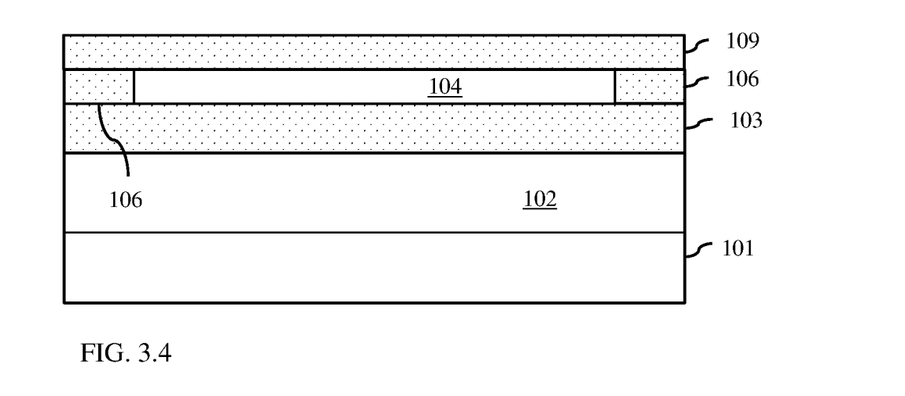

Next, an isolation layer 109 can be formed over the semiconductor layer 104 and adjacent STI regions 106 (see process 214 and FIG. 3.4). This isolation layer 109 can, for example, be a silicon dioxide layer formed at process 214 using a conventional oxidation process.

A base opening 110 can then be formed in the isolation layer 109 (see process 216 and FIGS. 3.5A and 3.5B). Specifically, at process 214, conventional lithographic processing and etch techniques can be performed in order to form a base opening 110 in the isolation layer 109. The base opening 110 can, for example, be formed so that it extends vertically through the isolation layer 109 to the semiconductor layer 104, so that it completely traverses and exposes a center portion of the semiconductor layer, so that it has a first width (Wbo), and so that portions of the semiconductor layer on either side of the base opening 110 remain covered.

First sidewall spacers 108 can then be formed within the base opening 110. For example, a dielectric spacer material can be conformally deposited so as to cover the top surface of the isolation layer 109 and so as to line the base opening 110 (see FIGS. 3.6A and 3.6B). The dielectric spacer material can be, for example, silicon nitride or some other suitable dielectric spacer material that is different from the isolation material of the isolation layer 109 so that it can be selectively etched over the isolation material 107. Next, a selective anisotropic sidewall spacer etch process can be performed in order to remove the dielectric spacer material from horizontal surfaces, leaving it intact on vertical surfaces within the base opening (i.e., as the first sidewall spacers 108). By forming the first sidewall spacers 108 within the base opening 110, the width of the base opening 110 is narrowed from the first width (Wbo) to a second width (Wfbo) that is narrower than the first width and a first area of the semiconductor layer is exposed. It should be noted that the first width could be at or near the minimum width achievable using conventional state of the art lithographic patterning and the second width can be smaller than that minimum width.

Figure 37:
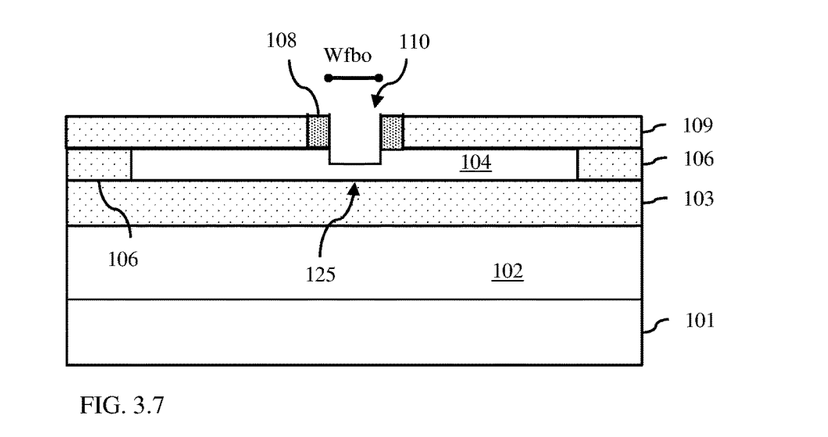

A first area 125 of the semiconductor layer 104 that is exposed at the bottom of the base opening can, optionally, be recessed (see process 218 and FIG. 3.7). That is, a selective anisotropic etch process can be performed in order to recess (i.e., etch back) the top surface of the first area 125 of the semiconductor layer 104 exposed at the bottom of the base opening 110. This selective anisotropic etch process should be performed without etching entirely through the semiconductor layer 104 such that at least a lower portion of the first area 125 of the semiconductor layer 104 remains intact and can subsequently be used as a seed layer. The first area 125 of the semiconductor layer 104 aligned below the base opening 110 (recessed, as illustrated, or not) can correspond to a first base region 131.1 of a base 131 of the lateral BJT (e.g., the standard BJT or HBT) being formed.

Figure 38:
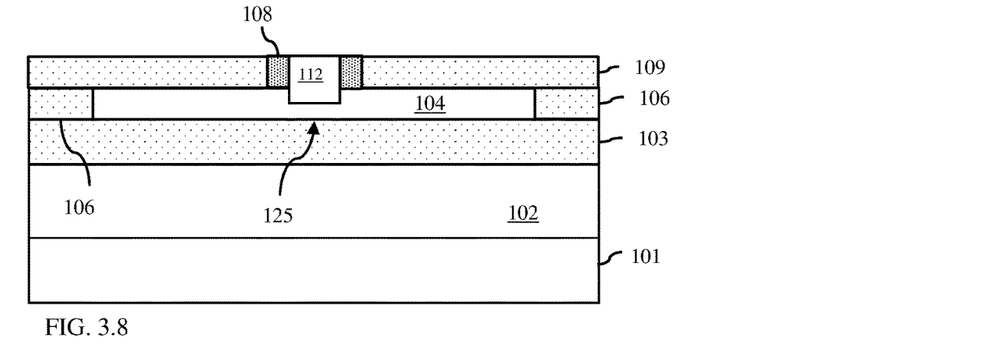

Then, a second base region 131.2 can be formed in the base opening 110 on the first base region 131.1 (see process 220 and FIG. 3.8). Specifically, an epitaxial semiconductor layer 112 can be grown on the top surface of the exposed first area 125 of the semiconductor layer 104 within the relatively narrow base opening 110, which is defined by the space between first sidewall spacers 108. The epitaxial semiconductor layer 112 can be selectively grown from the semiconductor layer 104 at process 220 so that it is essentially monocrystalline in structure. For a standard BJT, this semiconductor layer 104 and the epitaxial semiconductor layer 112 can be the first semiconductor material (e.g., silicon). For an HBT, the semiconductor layer 104 could be the first or second semiconductor material (e.g., silicon or silicon germanium) but the epitaxial semiconductor layer 112 can specifically be the second semiconductor material (e.g., silicon germanium). In either case, the epitaxial semiconductor layer 112 can be grown at process 220 without any in-situ doping (i.e., so that it remains undoped/intrinsic). Alternatively, this epitaxial semiconductor layer 112 can be in-situ doped at process 220 so that it has the first-type conductivity at a relatively low conductivity level or so that it has a graded dopant profile (e.g., from undoped or low-doped proximal to the first base region and higher doped distal to the first base region).

Thus, following process 220, for an NPN-type standard BJT, the second base region 131.2 can be a monocrystalline intrinsic silicon base region (i-Si base), a P– monocrystalline silicon base region, or a monocrystalline silicon base region with a graded dopant profile from undoped or P– proximal to the first base region to P or P+ distal to the first base region. For an NPN-type HBT, the second base region 131.2 can be a monocrystalline intrinsic silicon germanium base region (i-SiGe base), a monocrystalline P– silicon germanium base region, or a monocrystalline silicon germanium base region with a graded dopant profile from undoped or P– proximal to the first base region to P or P+ distal to the first base region. For a PNP-type standard BJT, the second base region 131.2 can be a monocrystalline intrinsic silicon base region (i-Si base), an N– monocrystalline silicon base region, or a monocrystalline silicon base region with a graded dopant profile from undoped or N– proximal to the first base region to N or N+ distal to the first base region. For a PNP-type HBT, the second base region 131.2 can be a monocrystalline intrinsic silicon germanium base region (i-SiGe base), a monocrystalline N– silicon germanium base region, or a monocrystalline silicon germanium base region with a graded dopant profile from undoped or N– proximal to the first base region to N or N+ distal to the first base region.

Figure 39:
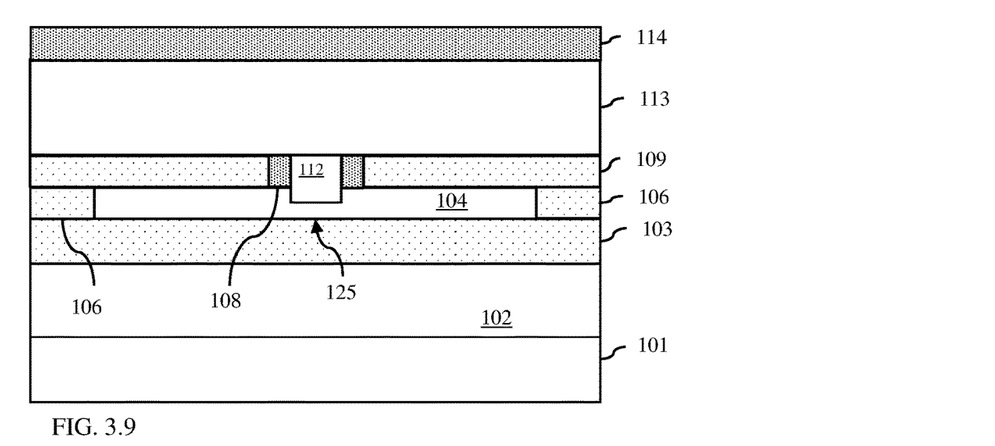

Another epitaxial semiconductor layer 113 of the first semiconductor material (e.g., silicon) or of some other suitable base semiconductor material can be grown on the second base region 131.1 and over the isolation layer 109 (see process 222 and FIG. 3.9). The epitaxial semiconductor layer 113 can be non-selectively grown at process 222 from the second base region and from the isolation layer so that it is essentially polycrystalline in structure. The epitaxial semiconductor layer 113 can be in-situ doped at process 222 so as to have the first-type conductivity at a relatively high conductivity level. Thus, for example, for an NPN-type standard BJT or HBT, this epitaxial semiconductor layer 113 can be a P+ polycrystalline semiconductor layer (e.g., a P+ polysilicon layer), whereas, for a PNP-type standard BJT or HBT, this epitaxial semiconductor layer 113 can be an N+ polycrystalline semiconductor layer (e.g., an N+polysilicon layer).

A thin cap layer (e.g., a thin silicon nitride cap layer 114) can be formed on the epitaxial semiconductor layer 113 (see FIG. 3.9).

Figure 310:
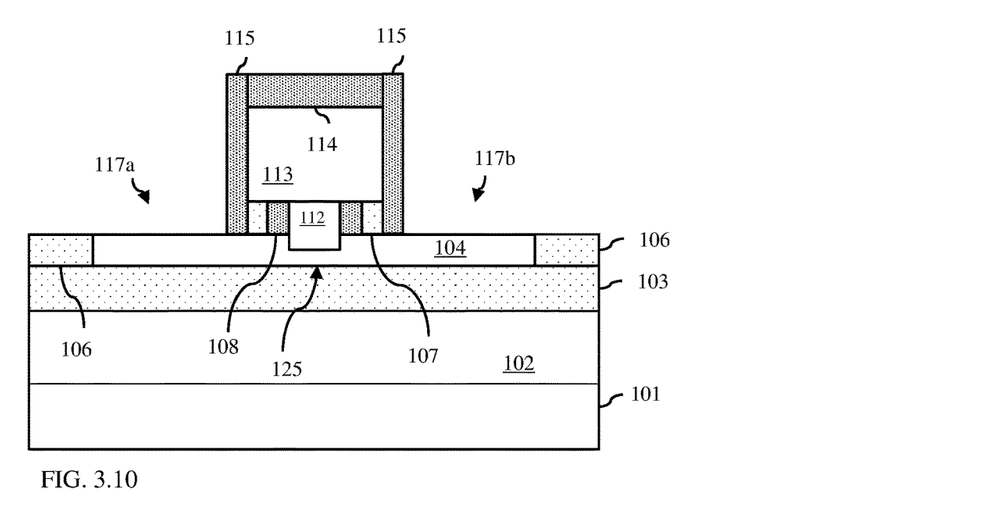

A base stack can subsequently be formed (see process 224 and FIG. 3.10). Specifically, lithographic patterning and etch processes can be performed to define a third base region 131.3 from a portion of the epitaxial semiconductor layer 113 aligned above the second base region 131.2 and to further define second sidewall spacers 107 (from the isolation layer 109) positioned laterally adjacent to the first sidewall spacers 108. Due to the lithographic patterning and etch processes performed at process 224, the resulting third base region 131.3 can be aligned above, immediately adjacent to, and wider than the second base region 131.2 such that it extends laterally over the first sidewall spacers 108 and the resulting second sidewall spacers 107. Thus, the base 131 is essentially T-shaped and opposing sidewalls of the third base region 131.3 are essentially vertically aligned with outer vertical surfaces of the second sidewall spacers 107. Third sidewall spacers 115 can then be formed on the base stack and, particularly, adjacent to the opposing sidewalls of the third base region 131.3 and further adjacent to the outer vertical surfaces of the second sidewall spacers 107 below (see FIG. 3.10). For example, another dielectric spacer material can be conformally deposited so as to cover the base stack. The dielectric spacer material used to form the third sidewall spacers can be, for example, silicon nitride or some other suitable dielectric spacer material. Next, a selective anisotropic sidewall spacer etch process can be performed in order to remove the dielectric spacer material from horizontal surfaces and, particularly, from second and third areas 117a-117b, respectively, of the semiconductor layer 104 on opposing sides of the base stack and leaving it intact on the vertical surfaces (i.e., as the third sidewall spacers 115).

Optionally, the second and third areas 117a-117b of the semiconductor layer 104 that are exposed during formation of the third sidewall spacers 115 can be recessed (not shown). That is, a selective anisotropic etch process can be performed in order to recess (i.e., etch back) the top surface of the semiconductor layer 104 in the second and third areas 117a-117b of the semiconductor layer 104. This selective anisotropic etch process should be performed without etching entirely through the semiconductor layer 104 such that portions of the semiconductor layer 104 remain intact and can subsequently be used as seed layers.

Figure 311:
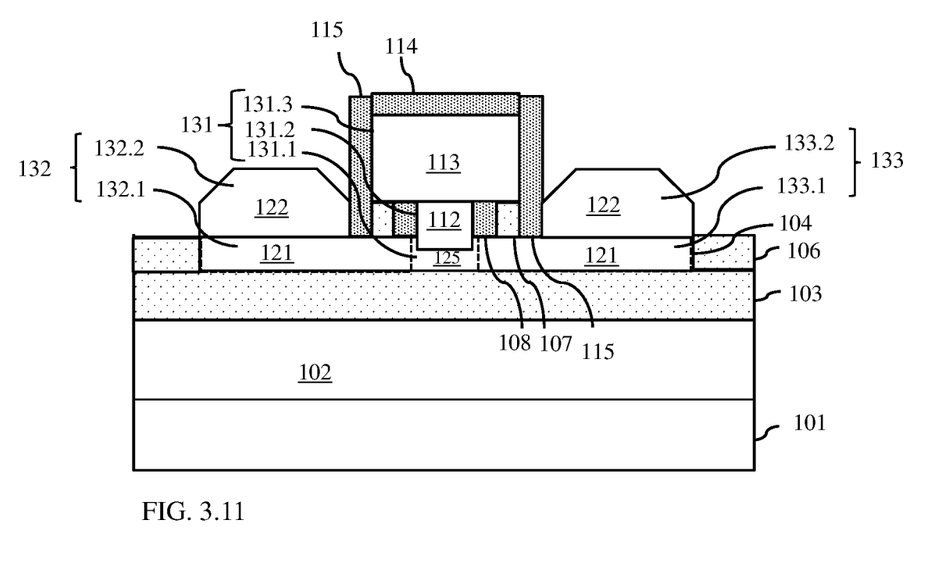

A collector 133 and an emitter 132 can then be formed on opposing sides of the base stack (see process 226 and FIG. 3.11). For example, additional epitaxial semiconductor layers 122 of the first semiconductor material (e.g., silicon) or of some other suitable collector/emitter semiconductor material can be selectively grown from the exposed semiconductor surfaces of the second and third areas 117a-117b of the semiconductor layer 104 such that they are essentially monocrystalline in structure. The additional epitaxial semiconductor layers 122 can be in situ doped at process 226 so as to have the second-type conductivity at a relatively high conductivity level. Thus, for example, for an NPN-type transistor, the additional epitaxial semiconductor layers 122 can be N+ monocrystalline semiconductor layers (e.g., N+ silicon layers), whereas, for a PNP-type transistor, the additional epitaxial semiconductor layers 122 can be P+ monocrystalline semiconductor layers (e.g., P+ silicon layers). A subsequent anneal process can cause dopants from the additional epitaxial semiconductor layers 122 to diffuse into the second and third areas 117a-117b of the semiconductor layer to form doped regions 121 with the second-type conductivity. In this case, the doped regions 121 of the second and third areas 117a-117b of the semiconductor layer 104 form lower emitter and collector regions 132.1, 133.1 of the emitter 132 and collector 133, respectively. Additionally, the additional epitaxial semiconductor layers 122 grown on the second and third areas 117a-117b of the semiconductor layer 104 form upper emitter and collector regions 132.2, 133.2 of the emitter 132 and collector 133, respectively. It should be noted that process 226 is just one exemplary process flow that could be employed to form the emitter 132 and the collector 133 on opposing sides of the base stack. Alternatively, any other suitable process flow could be employed resulting in symmetrical or asymmetrical emitter/collector regions.

Figure 312:
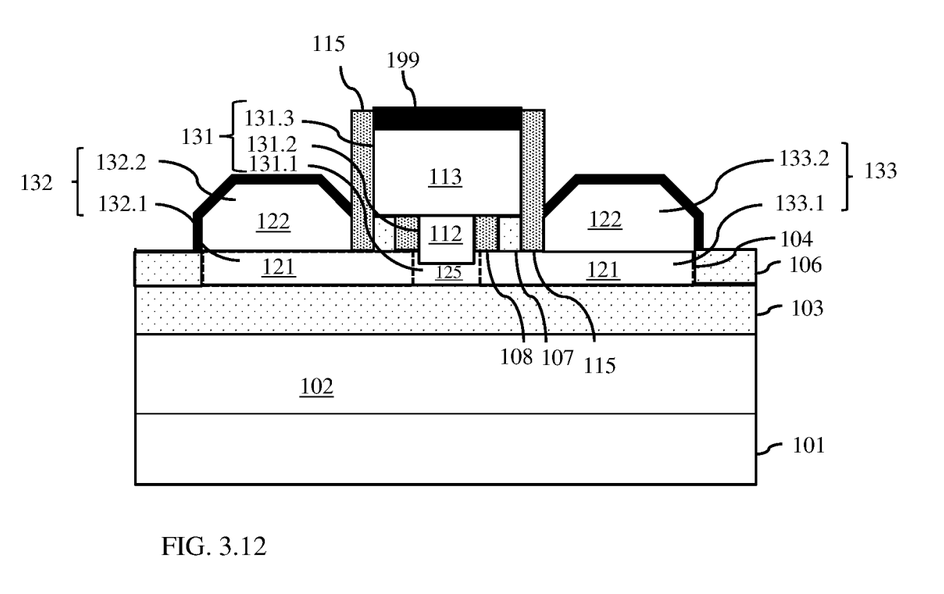

Optionally, the method embodiments can further include selectively removing the cap 114 from the top of the base 131 and forming metal silicide layers 199 on the uppermost surfaces of the base 131, the collector 133, and the emitter 132 (see process 252 and FIG. 3.12). The metal silicide layers 199 can be, for example, layers of cobalt silicide (CoSi), nickel silicide (NiSi), tungsten silicide (WSi), titanium silicide (TiSi), or any other suitable metal silicide material. Techniques for forming metal silicide layers are well known in the art and, thus, have been omitted from the specification to allow the reader to focus on the salient aspects of the disclosed embodiments.

Figure 313:
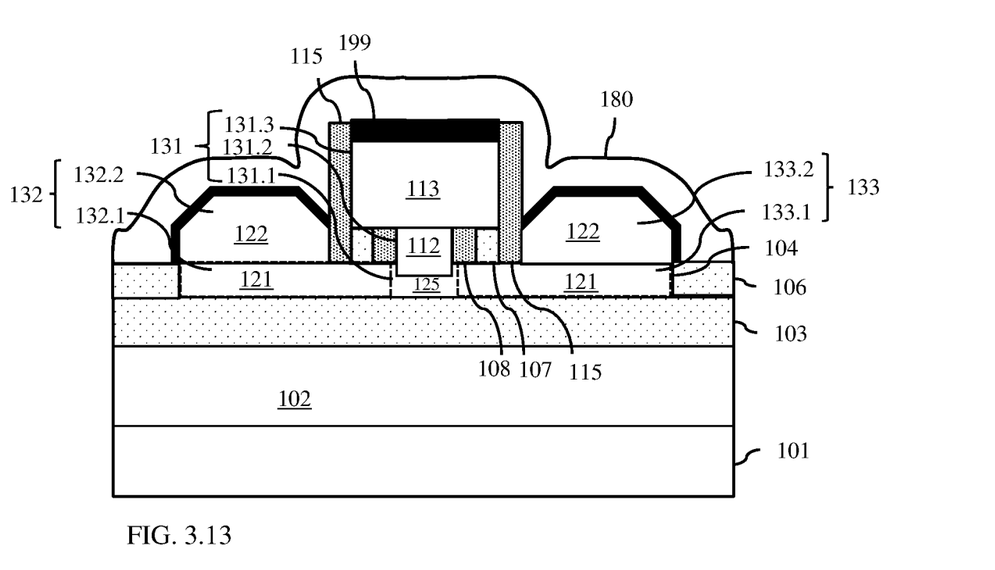
Figure 314:
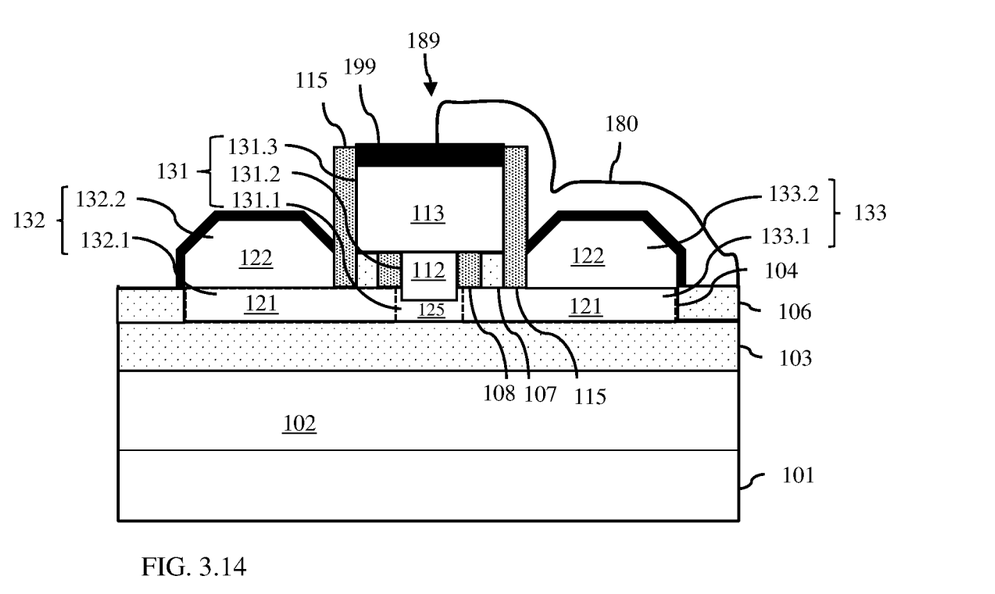

The method embodiments can further include forming a conformal first dielectric layer 180 and, particularly, a dielectric stress layer so that it only partially covers the lateral BJT 150 (see process 254 and FIGS. 3.13-3.14). The first dielectric layer 180 (i.e., the dielectric stress layer) can, for example, be a silicon nitride stress layer deposited and further processed, as necessary, so as to have either a tensile strain or a compressive strain, depending upon whether the lateral BJT 150 is an NPN-type transistor or a PNP-type transistor. For example, for an NPN-type transistor, the first dielectric layer 180 can be deposited and further processed, as necessary, at process 254 so that it is a tensilely strained layer, whereas, for a PNP-type transistor, the first dielectric layer 180 can be deposited and optionally further processed, as necessary, at process 254 so that it is a compressively strained layer. Various techniques for forming tensilely strained dielectric layers and compressively strained dielectric layers are well known in the art and could be employed in the disclosed method. However, the details of those techniques have been omitted from this specification in order to allow the reader to focus on the salient aspects of the disclosed embodiments.

In any case, the first dielectric layer 180 can subsequently be lithographically patterned and etched so that it only partially covers the lateral BJT 150 and so that it has one end aligned above the transistor somewhere between the collector and the emitter. For example, the first dielectric layer 180 can be lithographically patterned and etched so that it covers only one side of the lateral BJT 150 and so that one end 189 is aligned above the lateral BJT 150 somewhere between the collector 133 and the emitter 132. In some embodiments, the first dielectric layer 180 can be patterned and etched so that it completely covers the collector 133, so that it partially covers the base 131, and so that it has one end 189 aligned above the base 131, as illustrated. Alternatively, the first dielectric layer 180 could be lithographically patterned and etched so that it completely covers the collector 133, so that it extends completely over the base 131, and so that it has one end 189 aligned above the third sidewall spacer 115 between the base 131 and the emitter 132. With a first dielectric layer positioned over the collector 133 and at least partially over the base 131, the collector 133 and base 131 (and the collector-base junction) will be strained, whereas the emitter 132 will remain relaxed.

For example, in the case of an NPN-type transistor where the first dielectric layer 180 is tensilely strained, the collector 133 will be a longitudinally tensile and vertically compressive collector, the base 131 will similarly be a longitudinally tensile and vertically compressive base, whereas the emitter 132 will be a relaxed emitter. However, in the case of a PNP-type transistor where the first dielectric layer 180 is compressively strained, the collector 133 will be a longitudinally compressive and vertically tensile collector, the base 131 will similarly be a longitudinally compressive and vertically tensile base, whereas the emitter 132 will be a relaxed emitter. Maximum performance benefits and, particularly, enhanced charge carrier mobility and, thereby faster switching speeds have been exhibited in embodiments with such an asymmetric dielectric stress layer above the collector-base junction and not above the emitter-base junction.

It should be understood that the figures are not intended to be limiting and that, alternatively, the first dielectric layer could be patterned and etched so that it covers some different portion of the lateral BJT in order to fine tune the strain applied to the different components of the lateral BJT 150. For example, the first dielectric layer 180 could be patterned and etched so that it completely covers the collector 133 only, so that it does not extend onto the base 131, and so that it has one end 189 aligned above the third sidewall spacer 115 between the base 131 and the collector 133. In this case, only the collector would be strained and the base and the emitter would be relaxed. Alternatively, the first dielectric layer 180 could be patterned and etched so that it only partially covers the collector 133 and so that it either partially or completely covers the base 131. In these cases, both the collector and base would be strained to some lesser extent and the emitter would still be relaxed. Alternatively, the first dielectric layer 180 could be patterned and etched so that it is on the emitter 132 and, optionally, so that it extends onto and/or over the base 131 without further extending onto the collector 133 (e.g., so that the emitter and optionally the base are strained but the collector is relaxed), and so on.

Furthermore, it should be understood that the techniques described above for formation of the first dielectric layer 180 only partially covering the transistor are offered for illustration purposes and not intended to be limiting. For example, alternatively, a mask layer could be formed over the partially complete structure. The mask layer could be patterned so as to have an opening that exposes one portion of the lateral BJT and so that another portion of the lateral BJT remains covered. The first dielectric layer and, particularly, the dielectric stress layer could be formed within the trench and the mask layer could be selectively removed.

The method embodiments can further include forming one or more second dielectric layers 185 on the first dielectric layer 180 and further extending laterally beyond the end 189 of the first dielectric layer 180 over the portion of the lateral BJT 150 not covered by the first dielectric layer 180 (see process 256). Although not shown, these dielectric layers can include, for example, one or more conformal dielectric layers (e.g., another conformal silicon nitride etch stop layer) and a blanket dielectric layer (e.g., a blanket silicon dioxide layer or a blanket layer of some other suitable dielectric material) on the conformal dielectric layer(s). The method embodiments can further include formation of middle of the line (MOL) contacts including contacts extending through the dielectric layer(s) to the base, collector, and emitter (see process 258).

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped with a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a transistor comprising: a base; a collector; and an emitter, wherein the base has sidewall spacers on opposing sidewalls and is positioned laterally between the collector and the emitter; and
   a first dielectric layer partially covering the transistor, wherein the first dielectric layer is above at least one of the sidewall spacers, and has one end above the transistor between the collector and the emitter, and wherein the first dielectric layer completely covers the collector and at least partially covers the base.

2. The structure of claim 1, wherein the first dielectric layer comprises a stress layer.

3. The structure of claim 1, wherein the first dielectric layer comprises a silicon nitride layer with one of a tensile strain and a compressive strain.

4. The structure of claim 1, wherein the transistor comprises an NPN-type heterojunction bipolar transistor and the first dielectric layer comprises a tensilely strained layer.

5. The structure of claim 1, wherein the transistor comprises a PNP-type heterojunction bipolar transistor and the first dielectric layer comprises a compressively strained layer.

6. The structure of claim 1, further comprising a second dielectric layer on the first dielectric layer and further extending laterally beyond the end of the first dielectric layer over the emitter.

7. A structure comprising:
   an insulator layer;
   a semiconductor layer on the insulator layer;
   a transistor comprising:
     a base comprising: a first base region within the semiconductor layer; a second base region on the first base region; and a third base region on and wider than the second base region; and
     a collector; and an emitter, wherein the base is positioned laterally between the collector and the emitter, wherein the collector and the emitter comprise a first semiconductor material and wherein at least the second base region comprises a second semiconductor material different from the first semiconductor material; and
   a first dielectric layer partially covering the transistor, wherein one end of the first dielectric layer is above the transistor between the collector and the emitter.

8. The structure of claim 7, wherein the first dielectric layer comprises a stress layer.

9. The structure of claim 7, wherein the first dielectric layer comprises a silicon nitride layer with one of a tensile strain and a compressive strain.

10. The structure of claim 9, wherein the transistor comprises an NPN-type heterojunction bipolar transistor and the first dielectric layer comprises a tensilely strained layer.

11. The structure of claim 9, wherein the transistor comprises a PNP-type heterojunction bipolar transistor and the first dielectric layer comprises a compressively stained layer.

12. The structure of claim 7, wherein the first dielectric layer covers the collector and at least partially covers the base.

13. The structure of claim 12, further comprising a second dielectric layer on the first dielectric layer and further extending laterally beyond the end of the first dielectric layer over the collector.

14. A method comprising:
    forming a transistor comprising: a base; a collector; and an emitter, wherein the base has sidewalls spacers on opposing sidewalls and is positioned laterally between the collector and the emitter; and
    forming first dielectric layer partially covering the transistor, wherein the first dielectric layer is above at least one of the sidewall spacers, and has one end above the transistor between the collector and the emitter and wherein the first dielectric layer is formed so as to completely cover the collector and at least partially cover the base.

15. The method of claim 14,
    wherein the forming of the transistor comprises forming an NPN-type heterojunction bipolar transistor, and
    wherein the forming of the first dielectric layer comprises forming a tensilely strained layer.

16. The method of claim 14,
    wherein the forming of the transistor comprises forming a PNP-type heterojunction bipolar transistor, and
    wherein the forming of the first dielectric layer comprises forming a compressively strained layer.

17. The method of claim 14,
    wherein the collector and the emitter are formed so as to comprise a first semiconductor material, and
    wherein the base is formed so as to comprise: a first base region within a semiconductor layer; a second base region on the first base region; and a third base region on and wider than the second base region with at least the second base region comprising a second semiconductor material that is different from the first semiconductor material.

18. The method of claim 14, further comprising forming a second dielectric layer on the first dielectric layer and further extending laterally beyond the end of the first dielectric layer over the emitter.

* * * * *